United States Patent

Han et al.

[11] Patent Number: 5,444,006
[45] Date of Patent: Aug. 22, 1995

[54] METHOD OF MANUFACTURING A CAPACITOR IN A SEMICONDUCTOR MEMORY DEVICE

[75] Inventors: Jeong-Su Han; Seung-Hee Lee, both of Cheongju-si, Rep. of Korea

[73] Assignee: Goldstar Electron Co., Ltd., Cheongju, Rep. of Korea

[21] Appl. No.: 147,634

[22] Filed: Nov. 5, 1993

[30] Foreign Application Priority Data

Nov. 7, 1992 [KR] Rep. of Korea .............. 92-20848

[51] Int. Cl.$^6$ .................................... H01L 21/8242
[52] U.S. Cl. ........................................ 437/60; 437/47; 437/52; 437/238
[58] Field of Search ............ 437/47, 52, 60, 200, 437/238; 259/310

[56] References Cited

U.S. PATENT DOCUMENTS

| | | | |
|---|---|---|---|
| 4,432,035 | 2/1984 | Hsieh et al. | 361/322 |
| 4,495,219 | 1/1985 | Kato et al. | 437/919 |
| 4,589,056 | 5/1986 | Stimmell | 361/311 |
| 4,742,025 | 5/1988 | Ohyu et al. | 437/200 |
| 4,891,684 | 2/1990 | Nishioka et al. | 437/919 |
| 4,937,650 | 6/1990 | Shinriki | 357/51 |
| 5,053,917 | 10/1991 | Miyasaki | 361/321 |
| 5,079,191 | 1/1992 | Shinriki | 437/235 |
| 5,111,355 | 5/1994 | Anand et al. | 361/311 |
| 5,142,438 | 8/1992 | Reinberg et al. | 361/313 |
| 5,336,638 | 9/1994 | Suzuki et al. | 437/919 |

*Primary Examiner*—Tom Thomas
*Attorney, Agent, or Firm*—Alan R. Loudermilk

[57] ABSTRACT

A method of manufacturing a capacitor in a semiconductor device such as a semiconductor memory is disclosed in which a tantalum layer is oxidized to form a tantalum oxide layer. A preferred embodiment of the disclosed method includes the steps of depositing doped polysilicon on a semiconductor substrate to form a node electrode, oxidizing the polysilicon node electrode to form a silicon oxide layer, depositing tantalum by way of a sputtering process, performing an annealing and oxidation process to form tantalum oxide and depositing polysilicon to form a plate electrode. According to the present invention, $TaCl_5$ is not used as a solid source, and contamination can be reduced.

16 Claims, 3 Drawing Sheets

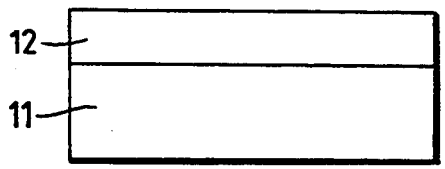
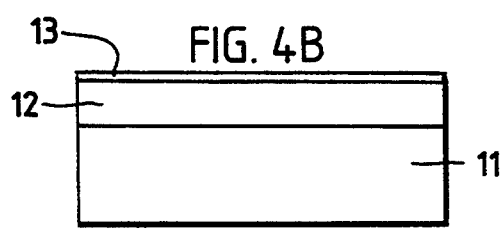
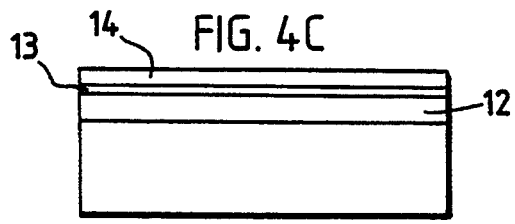
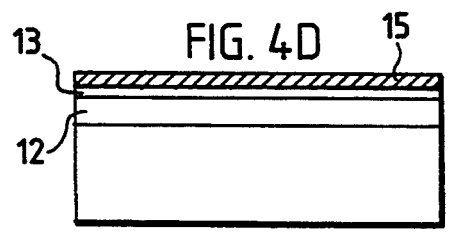
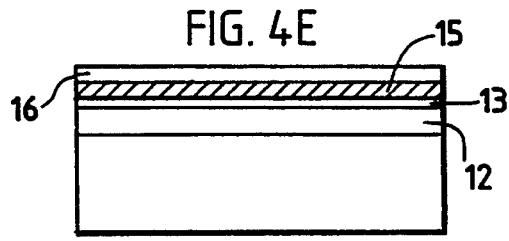
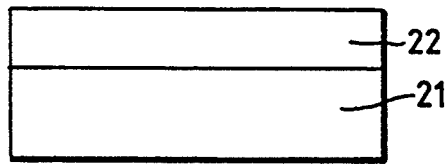
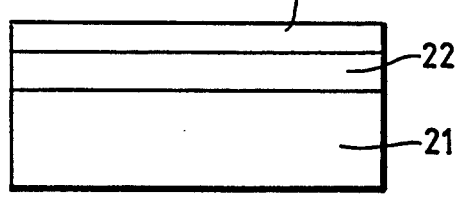
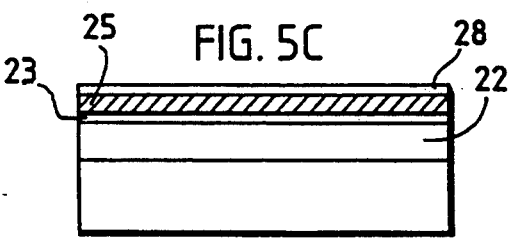
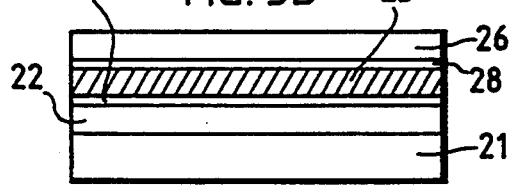

METHOD OF MANUFACTURING A CAPACITOR IN A SEMICONDUCTOR MEMORY DEVICE

BACKGROUND OF THE INVENTION

1. Field of the Invention

The present invention relates to a method of manufacturing capacitors in semiconductor memory devices, and more particularly to a method for making a tantalum layer that is oxidized to form a fine tantalum oxide layer providing a large capacitance in a semiconductor capacitor having a limited volume.

2. Description of the Prior Art

In conventional methods, a thin $Ta_2O_5$ layer, which was developed as a dielectric layer for storage electrodes in memory cells of highly integrated semiconductor devices such as 64M DRAMs, is formed by a chemical vapor deposition (CVD) method. Such a chemical vapor deposition method may include a low pressure chemical vapor deposition (LPCVD) method or a plasma enhanced chemical vapor deposition (PECVD) method.

In a typical LPCVD method, $Ta(OC_2H_5)_5$ and $O_2$ are used as reactive gases. After $O_2$ is introduced into a reactive furnace to stabilize the pressure of the furnace, $Ta(OC_2H_5)_5$ is introduced with Ar as a carrier gas, resulting in a deposited $Ta_2O_5$ layer on the surface of a wafer in the furnace.

$Ta(OC_2H_5)_5$ is thermally decomposed at a temperature of 170° C., while the pressure and temperature of the furnace are maintained at 0.5 Torr and between 300° and 470° C., respectively.

A typical PECVD method employs an inorganic Ta based on $TaCl_5$ and $N_2O$ as reactive gases. $TaCl_5$, which is a solid source, is evaporated at 120° C. and then introduced into a reactive furnace. Once $TaCl_5$ and $N_2O$ gases are simultaneously introduced into the furnace to stabilize the pressure of the furnace, an arc is supplied to cause the reaction of the gases to deposit Ta on a wafer surface, wherein the etching rate becomes minimized and the leakage current becomes extremely decreased, with an R.F. power of 0.5 W/cm². Consequently, such a PECVD method provides high density as well as relatively low carbon density, as compared with the LPCVD method. Furthermore, the pressure in the reactive furnace is maintained at about 0.8 Torr and the temperature is maintained at about 450° C.

FIG. 1 is a series of partial sectional views illustrating a conventional method of fabricating a capacitor in a semiconductor memory device by the LPCVD and PECVD processes. As illustrated in FIG. 1(A), doped node electrode 2 (capacitor storage electrode) is formed on semiconductor substrate 1. As illustrated in FIG. 1(B), tantalum oxide layer 3 is deposited on node electrode 2 by a LPCVD or a PECVD method. As illustrated in FIG. 1(C), doped polysilicon 4 as a plate electrode of a capacitor is formed on tantalum oxide layer 3, forming a capacitor in a semiconductor memory device. Additionally, in the case of LPCVD processing, an annealing process may be effective to minimize the ratio of carbon contained in the layer.

FIG. 2(A) is a partial sectional view of a capacitor with a tantalum oxide layer formed by a conventional LPCVD method. FIG. 2(B) is a partial sectional view of a capacitor with a tantalum oxide layer formed by a conventional PECVD method.

As illustrated in FIG. 2(A), a conventional method of fabricating a capacitor by a LPCVD method includes the following steps: doped polysilicon electrode node 2 (capacitor storage electrode node) is formed on semiconductor substrate 1 and on insulator 5, which had been formed in an earlier step; tantalum oxide layer 3 is then deposited on capacitor storage electrode node 2 by an LPCVD method; and doped polysilicon 4 for a plate electrode is deposited on tantalum oxide layer 3.

As illustrated in FIG. 2(B), a conventional method of fabricating a capacitor by a PECVD method includes the following steps: doped polysilicon electrode 2 is formed on semiconductor substrate 1 and on insulator 5, which had been formed in an earlier step; tantalum oxide layer 3 is then deposited on capacitor storage electrode node 2 by a PECVD method; and doped polysilicon 4 for a plate electrode is formed on tantalum oxide layer 3. When tantalum oxide layer 3 is deposited by a PECVD method, silicon oxide layer 9 is formed under tantalum oxide layer 3. Such a silicon oxide layer also may be formed with an LPCVD method during an annealing step.

FIG. 3 is a schematic sectional view of a memory cell structure in a semiconductor device according to the conventional method, wherein the reference numbers denote: 1—a semiconductor substrate; 2—a capacitor electrode node; 3—a tantalum oxide layer; 4—a capacitor plate electrode; 5—a gate insulator; and 7—a gate electrode.

When tantalum oxide layer 3 is formed by CVD processes such as illustrated in FIG. 2(A), a silicon oxide layer (not shown) is formed under tantalum oxide layer 3 during this procedure. As the memory cell is completed as illustrated in FIG. 3, silicon oxide layer 9 is absorbed in tantalum oxide layer 3.

Since an organic tantalum compound is employed to form a thin tantalum oxide layer by an LPCVD process according to the conventional method of fabricating a capacitor in a semiconductor memory device, the ratio of carbon contained in the tantalum oxide layer may be increased, resulting in an undesirable increase of leakage current. Contamination also is likely to occur during the PECVD process for forming a thin tantalum oxide layer. In addition, a silicon oxide layer is naturally formed between the tantalum oxide layer and the capacitor storage electrode node, resulting in an undesired increase of the overall thickness of the capacitor.

SUMMARY OF THE INVENTION

Accordingly, an object of the present invention is to solve problems of the conventional methods of fabricating a capacitor in a semiconductor memory device.

In the present invention, a thin tantalum oxide layer is made by sputtering or deposition after an oxidation process without using a solid source such as $TaCl_5$, thus a high-purity thin layer may be obtained with minimized leakage current and extremely reduced contamination.

An object of the present invention is to provide a method of fabricating a capacitor in a semiconductor memory device including the steps of: (a) depositing doped polysilicon on a semiconductor substrate to form a capacitor storage electrode node; (b) oxidizing the polysilicon electrode node to form a silicon oxide layer; (c) depositing tantalum by a sputtering process; (d) performing annealing and oxidation steps to form a tantalum oxide layer; and (e) depositing polysilicon to form a plate electrode.

Another object of the present invention is to provide a method of manufacturing a capacitor in a semiconductor memory device including the steps of: (a) depositing doped polysilicon on a semiconductor substrate; (b) forming tantalum silicide by a sputtering process; (c) performing annealing and oxidization steps to form a stacked structure of silicon oxide-tantalum oxide-silicon oxide; and (d) depositing polysilicon to form a plate electrode.

Still another object of the present invention is to provide a method of manufacturing a capacitor in a semiconductor memory device, including the steps of: (a) depositing doped polysilicon on a semiconductor substrate to form a storage electrode node; (b) oxidizing the polysilicon to form a silicon oxide layer; (c) depositing tantalum and tantalum silicide of a predetermined thickness; (d) performing an oxidation step to form a stacked structure of silicon oxide-tantalum oxide-silicon oxide; and (e) depositing a polysilicon layer to form a plate electrode.

These and other objects, features and advantages of the present invention will become apparent from the following description.

BRIEF DESCRIPTION OF THE DRAWINGS

FIGS. 4(A)-4(E) illustrate a first embodiment of a method of fabricating a capacitor in a semiconductor memory device according to the present invention;

FIGS. 5(A)-5(D) illustrate a second embodiment of a method of fabricating a capacitor in a semiconductor memory device according to the present invention.

DETAILED DESCRIPTION OF THE PREFERRED EMBODIMENTS

Figure 1A:
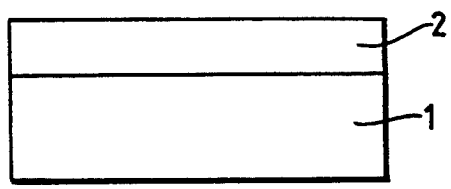
FIGS. 1(A)-1(C) are partial sectional views illustrating a conventional method of fabricating a capacitor in a semiconductor memory device.
Figure 1B:
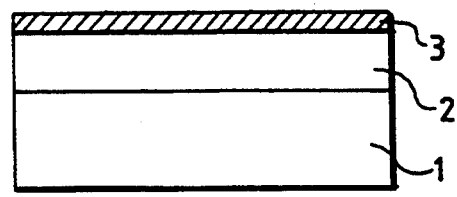
Figure 1C:
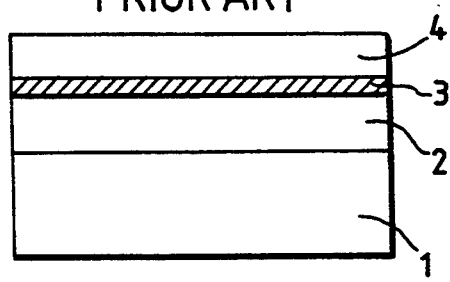
Figure 2A:
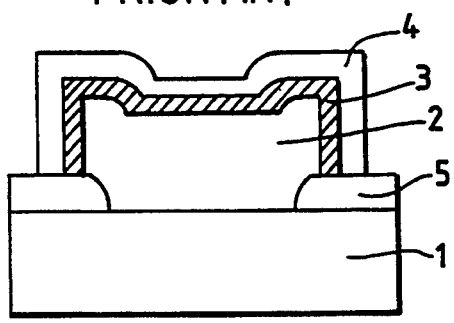
FIGS. 2(A)-2(B) illustrate exemplary views of a structure of a capacitor with a tantalum oxide layer formed by a conventional method.
Figure 2B:
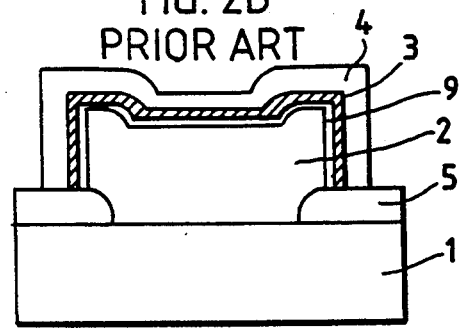
Figure 3:
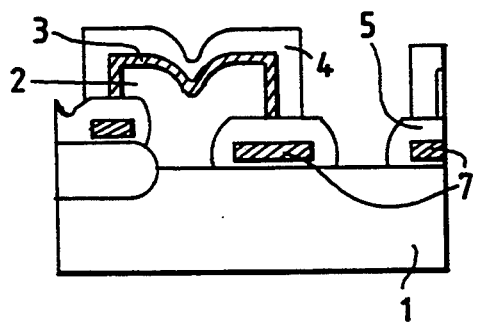
FIG. 3 is a schematic sectional view illustrating a structure of a semiconductor memory cell according to a conventional method.

FIG. 4 illustrates a first method of fabricating a capacitor in a semiconductor memory device according to the present invention. As illustrated in FIG. 4(A), doped polysilicon layer 12 is deposited on semiconductor substrate 11 to form a storage electrode node. As illustrated in FIG. 4(B), doped polysilicon layer 12 is oxidized to form silicon oxide layer 13 on the surface. As illustrated in FIG. 4(C), tantalum layer 14 is deposited on silicon oxide layer 13, by either a sputtering or CVD method. As illustrated in FIG. 4(D), tantalum layer 14 is oxidized in a thermal diffusion furnace in an oxygen ambience, wherein tantalum layer 14 is re-formed to tantalum oxide layer 15, which is densified. As illustrated in FIG. 4(E), a material selected from among polysilicon, metal or silicide is deposited on tantalum oxide layer 15 to form plate electrode 16. Plate electrode 16 can be formed with doped polysilicon, silicide (such as $WSi_x$, $TiSi_x$ or $TaSi_x$), TiN, etc., so as to determine the I-V characteristics of the capacitor.

FIG. 5 illustrates a second method of fabricating a capacitor in a semiconductor memory device according to the present invention. As illustrated in FIG. 5(A), doped polysilicon layer 22 is deposited on semiconductor substrate 21 to form a storage electrode node. As illustrated in FIG. 5(B), tantalum silicide layer 27 is deposited on doped polysilicon layer 22 by a sputtering process. As illustrated in FIG. 5(C), an oxidation process is performed, resulting in tantalum silicide layer 27 being converted into tantalum oxide layer 25, resulting in a stacked structure of silicon oxide layer 23—tantalum oxide layer 25—silicon oxide layer 28 (a $SiO_2$—$Ta_2O_5$—$SiO_2$ structure). As illustrated in FIG. 5(D), conductive material, such as polysilicon, metal, silicide, etc., is deposited on silicon oxide layer 28 to form plate electrode 26.

Tantalum (Ta) layer 14 and tantalum silicide 27 ($TaSi_x$: $x = 1.0 - 5.0$) in FIGS. 4(C) and FIG. 4(D) and FIGS. 5(B) and 5(C) are deposited by a conventional sputtering method with an R.F. power of about 2–6 KW and under Ar pressure of several milli Torr and annealed in a thermal diffusion furnace at a temperature of between about 800° and 1000° C. The annealed tantalum and tantalum silicide are subjected to an oxidation process effected in an oxygen ambience for about 5 to 60 minutes to form tantalum oxide 25.

FIG. 6 illustrates a third method of fabricating a capacitor in a semiconductor memory device according to the present invention. With this embodiment, silicon is not extracted after formation of the tantalum silicide layer, while silicon is likely to be extracted during the formation of the tantalum silicide layer in the embodiment of FIG. 5.

Figure 6A:
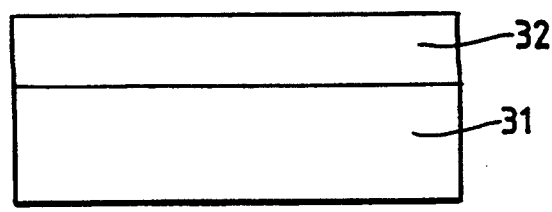
FIGS. 6(A)-6(E) illustrate a third embodiment of a method of fabricating a capacitor in a semiconductor memory device according to the present invention.
Figure 6B:
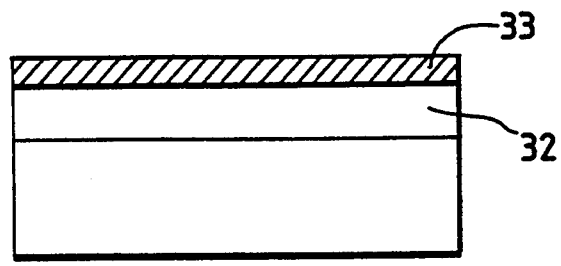
Figure 6C:
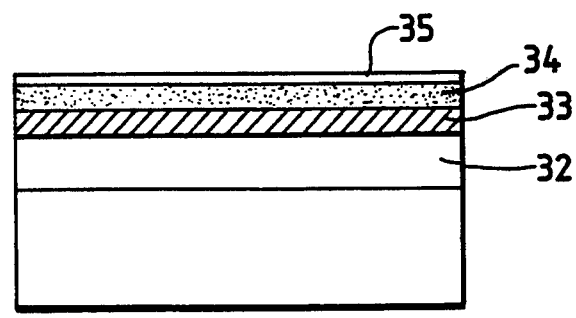
Figure 6D:
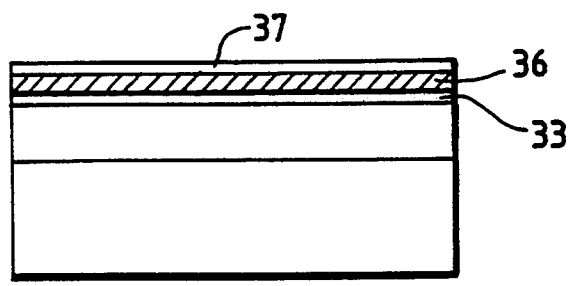
Figure 6E:
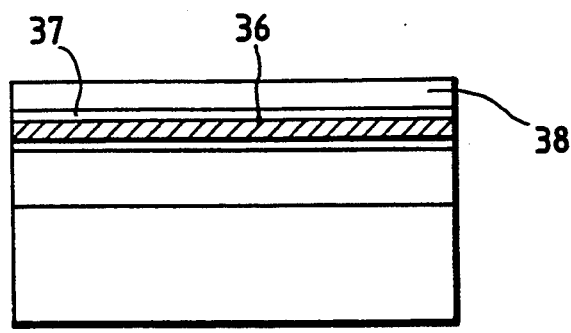

As illustrated in FIGS. 6(A) and 6(B), doped polysilicon layer 32 is deposited on semiconductor substrate 31 to form a storage electrode node and then oxidized to form silicon oxide layer 33 having a thickness of about 30 to 50 Angstroms. As illustrated in FIG. 6(C), tantalum layer 34 and tantalum silicide layer 35, each having a thickness of about 100 to 200 Angstroms, are deposited on silicon oxide layer 33 in the cited order, and then subjected to an annealing process effected by a thermal diffusion furnace at a temperature of about 800° to 1000° C. As illustrated in FIG. 6(D), annealed tantalum layer 34 and tantalum silicide layer 35 that were formed on silicon oxide layer 33 are oxidized in an oxygen ambience at an $O_2$ flow rate of about 10 to 20 liters/minute, for about 5 to 60 minutes so as to obtain a structure of silicon oxide layer 33, tantalum oxide layer 36 and silicon oxide layer 37 (a $SiO_2$—$Ta_2O_5$—$SiO_2$ structure). As illustrated in FIG. 6(E), plate electrode 38 is formed of a suitable material such as doped polysilicon, silicide, TiN, or the like.

Since tantalum is oxidized after sputtering or a CVD process, a high-purity thin layer may be formed with the present invention.

In accordance with the present invention, as the possibility of carbon contamination is reduced, leakage current can be minimized. Furthermore, the contamination can be extremely decreased owing to not employing a solid source such as $TaCl_5$, as opposed to certain conventional techniques using PECVD, in which the characteristics of the layer may be deteriorated due to contamination of $TaCl_5$. In addition, since a sputter system and an electric furnace may be used in the present invention, the cost of developing an apparatus for fabricating a semiconductor device may be reduced, and the process may be simplified desirably.

Although various preferred embodiments of the present invention have been disclosed for illustrative purposes, those skilled in the art will appreciate that various modifications, additions and/or substitutions are possible without departing from the scope and spirit of the present invention as defined in the claims.

What is claimed is:

1. A method of manufacturing a capacitor in a semiconductor device, comprising the steps of:
   depositing a doped polysilicon layer on a semiconductor substrate to form a storage node electrode;
   oxidizing the polysilicon storage node electrode to form a silicon oxide layer;
   depositing a tantalum layer and a tantalum silicide layer on the silicon oxide layer in the cited order;
   annealing and oxidizing said tantalum and tantalum silicide layers to form a silicon oxide-tantalum oxide-silicon oxide stacked structure on said storage node electrode; and
   forming a plate electrode on the stacked structure.

2. The method of claim 1, wherein the plate electrode is formed of polysilicon.

3. The method of claim 1, wherein the tantalum and tantalum silicide layers are deposited under conditions such that each of these layers has a thickness of about 100 to 200 Angstroms.

4. The method of claim 1, wherein the silicon oxide layer on the storage node electrode is formed to a thickness of about 30 to 50 Angstroms.

5. The method of claim 1, wherein the annealing and oxidation process is carried out at a temperature in the range of about 800° to 1000° C. and in an oxygen ambience for a time in the range of about 5 to 60 minutes.

6. The method of claim 1, wherein the tantalum layer is formed by a sputtering process.

7. The method of claim 1, wherein the tantalum layer is formed by a vapor deposition process.

8. The method of claim 1, wherein the tantalum silicide layer is formed by a sputtering process.

9. A method of manufacturing a capacitor in a semiconductor device, comprising the steps of:
   forming a first semiconductor layer on a substrate;
   forming a silicon oxide layer on said first semiconductor layer
   forming a tantalum layer and a tantalum silicide layer on the silicon oxide layer;
   oxidizing the tantalum layer and the tantalum silicide layer, wherein a silicon oxide-tantalum oxide-silicon oxide stacked structure is formed on the first semiconductor layer; and
   forming a plate electrode on the stacked structure.

10. The method of claim 9, wherein the plate electrode comprises polysilicon.

11. The method of claim 9, wherein the tantalum and tantalum silicide layers are formed under conditions such that each of these layers has a thickness of about 100 to 200 Angstroms.

12. The method of claim 9, wherein the silicon oxide layer is formed on the first semiconductor layer to a thickness of about 30 to 50 Angstroms.

13. The method of claim 9, wherein the oxidizing step is carried out at a temperature in the range of about 800° to 1000° C. and in an oxygen ambience for a time in the range of about 5 to 60 minutes.

14. The method of claim 9, wherein the tantalum layer is formed by a sputtering process.

15. The method of claim 9, wherein the tantalum layer is formed by a vapor deposition process.

16. The method of claim 9, wherein the tantalum silicide layer is formed by a sputtering process.

* * * * *